United States Patent
Oh et al.

(10) Patent No.: US 12,464,717 B2
(45) Date of Patent: Nov. 4, 2025

(54) SEMICONDUCTOR MEMORY DEVICE AND A MANUFACTURING METHOD OF THE SEMICONDUCTOR MEMORY DEVICE

(71) Applicant: SK hynix Inc., Icheon-si (KR)

(72) Inventors: Jae Young Oh, Icheon-si (KR); Joong Gyu Kim, Icheon-si (KR)

(73) Assignee: SK hynix Inc., Icheon-si (KR)

(\*) Notice: Subject to any disclaimer, the term of this patent is extended or adjusted under 35 U.S.C. 154(b) by 730 days.

(21) Appl. No.: 17/731,787

(22) Filed: Apr. 28, 2022

(65) Prior Publication Data

US 2023/0137896 A1     May 4, 2023

(30) Foreign Application Priority Data

Nov. 3, 2021   (KR) .......................... 10-2021-0150102

(51) Int. Cl.
   *H10B 43/27*      (2023.01)
   *H01L 23/528*     (2006.01)
   *H10B 41/27*      (2023.01)

(52) U.S. Cl.
   CPC .......... *H10B 43/27* (2023.02); *H01L 23/5283* (2013.01); *H10B 41/27* (2023.02)

(58) Field of Classification Search
   CPC ........ H10B 43/27; H10B 41/27; H10B 43/50; H10B 43/30; H01L 23/5283; H01L 24/08; H01L 25/18; H01L 25/50
   See application file for complete search history.

(56) References Cited

U.S. PATENT DOCUMENTS

| | | | |
|---|---|---|---|
| 10,665,580 B1 * | 5/2020 | Hosoda | H01L 25/0657 |
| 2020/0258816 A1 * | 8/2020 | Okina | H10B 43/40 |
| 2021/0074717 A1 * | 3/2021 | Lim | H10B 43/50 |
| 2022/0254802 A1 * | 8/2022 | Kwon | H01L 23/562 |

FOREIGN PATENT DOCUMENTS

KR        100375090 B1      3/2003

\* cited by examiner

*Primary Examiner* — Jonathan Han
(74) *Attorney, Agent, or Firm* — WILLIAM PARK AND ASSOCIATES LTD.

(57) ABSTRACT

A semiconductor memory device includes a plurality of conductive patterns and a plurality of second interlayer insulating layers arranged alternately with each other under a first interlayer insulating layer. The semiconductor memory device also includes a doped semiconductor layer including an amorphous area overlapping the first interlayer insulating layer and a crystalline area overlapping the first interlayer insulating layer with the amorphous area interposed between the first interlayer insulating layer and the crystalline area. The semiconductor memory device further includes a channel layer contacting the doped semiconductor layer and passing through the first interlayer insulating layer, the plurality of second interlayer insulating layers, and the plurality of conductive patterns. The semiconductor memory device additionally includes a memory layer between each of the conductive patterns and the channel layer.

10 Claims, 17 Drawing Sheets

SEMICONDUCTOR MEMORY DEVICE AND A MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2021-0150102 filed on Nov. 3, 2021, in the Korean Intellectual Property Office, the entire disclosure of which is incorporated by reference herein.

BACKGROUND

1. Technical Field

Various embodiments relate generally to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device may include a plurality of memory cells that store data. A three-dimensional semiconductor memory device may include a plurality of memory cells which are arranged in three dimensions. The three-dimensional arrangement of the memory cells may reduce a two-dimensional footprint of the plurality of memory cells on a substrate, and a degree of integration of the semiconductor memory device may be improved. With an increase in number of memory cells stacked over the substrate, the degree of integration of the semiconductor memory device may be further improved. However, the increase in the number of memory cells stacked over the substrate may result in deterioration of operating reliability of the three-dimensional semiconductor memory device.

SUMMARY

According to an embodiment, a semiconductor memory device may include a plurality of conductive patterns and a plurality of second interlayer insulating layers arranged alternately with each other under a first interlayer insulating layer. The semiconductor memory device may also include a doped semiconductor layer including an amorphous area overlapping the first interlayer insulating layer and a crystalline area overlapping the first interlayer insulating layer with the amorphous area interposed between the first interlayer insulating layer and the crystalline area. The semiconductor memory device may further include a channel layer contacting the doped semiconductor layer and passing through the first interlayer insulating layer, the plurality of second interlayer insulating layers, and the plurality of conductive patterns. The semiconductor memory device may additionally include a memory layer between each of the conductive patterns and the channel layer.

According to an embodiment, a method of manufacturing a semiconductor memory device may include forming a preliminary memory cell array structure including a first interlayer insulating layer including a first surface and a second surface facing in opposite directions, a plurality of conductive patterns and a plurality of second interlayer insulating layers stacked alternately with each other on the second surface of the first interlayer insulating layer, a channel layer passing through the first interlayer insulating layer, the plurality of conductive patterns, and the plurality of second interlayer insulating layers, and a memory layer between each of the plurality of conductive patterns and the channel layer. The method may also include forming an amorphous doped semiconductor layer over the first surface of the first interlayer insulating layer. The method may further include forming a doped semiconductor layer including a crystalline area and an amorphous area between the crystalline area and the first interlayer insulating layer by crystallizing a surface of the amorphous doped semiconductor layer. The method may additionally include diffusing impurities in the doped semiconductor layer into the channel layer.

DETAILED DESCRIPTION

Explanation of the present disclosure is merely an embodiment for structural or functional explanation, so the scope of the present teachings should not be construed to be limited to the embodiments explained in the embodiment. Therefore, various changes and modifications that fall within the scope of the claims, or equivalents of such scope are therefore intended to be embraced by the appended claims.

While terms such as "first" and "second" may be used to describe various components, such components should not be understood as being limited to the above terms. The above terms are used only to distinguish one component from another.

Various embodiments are directed to a semiconductor memory device capable of improving operating reliability and a manufacturing method of the semiconductor memory device.

Figure 1:
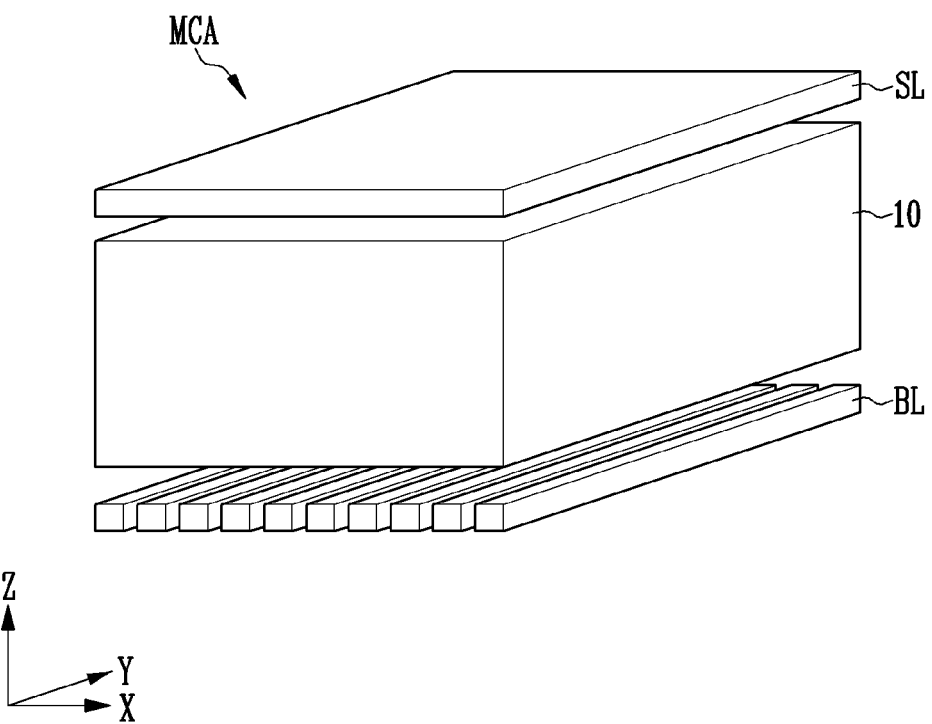
FIG. 1 is a schematic view of a memory cell array of a semiconductor memory device according to an embodiment of the present disclosure.

FIG. 1 is a schematic view of a memory cell array MCA of a semiconductor memory device according to an embodiment of the present disclosure.

Referring to FIG. 1, the memory cell array MCA may include a plurality of bit lines BL, a source layer SL, and a memory block 10.

The plurality of bit lines BL may be separated from each other and extend parallel to each other. According to an embodiment, the plurality of bit lines BL may be separated from each other in an X-axis direction and extend in a Y-axis direction. However, the embodiment of the present disclosure is not limited thereto. For example, the plurality of bit lines BL may extend in a diagonal direction between the X-axis and the Y-axis.

The source layer SL may overlap the plurality of bit lines BL with the memory block 10 interposed therebetween. The source layer SL may be a horizontal pattern that extends in the XY plane.

The memory block 10 may be disposed between the plurality of bit lines BL and the source layer SL. The memory block 10 may include a plurality of memory cell strings. Each of the plurality of memory cell strings may be coupled to a corresponding bit line BL and the source layer SL through a channel layer.

Figure 2:
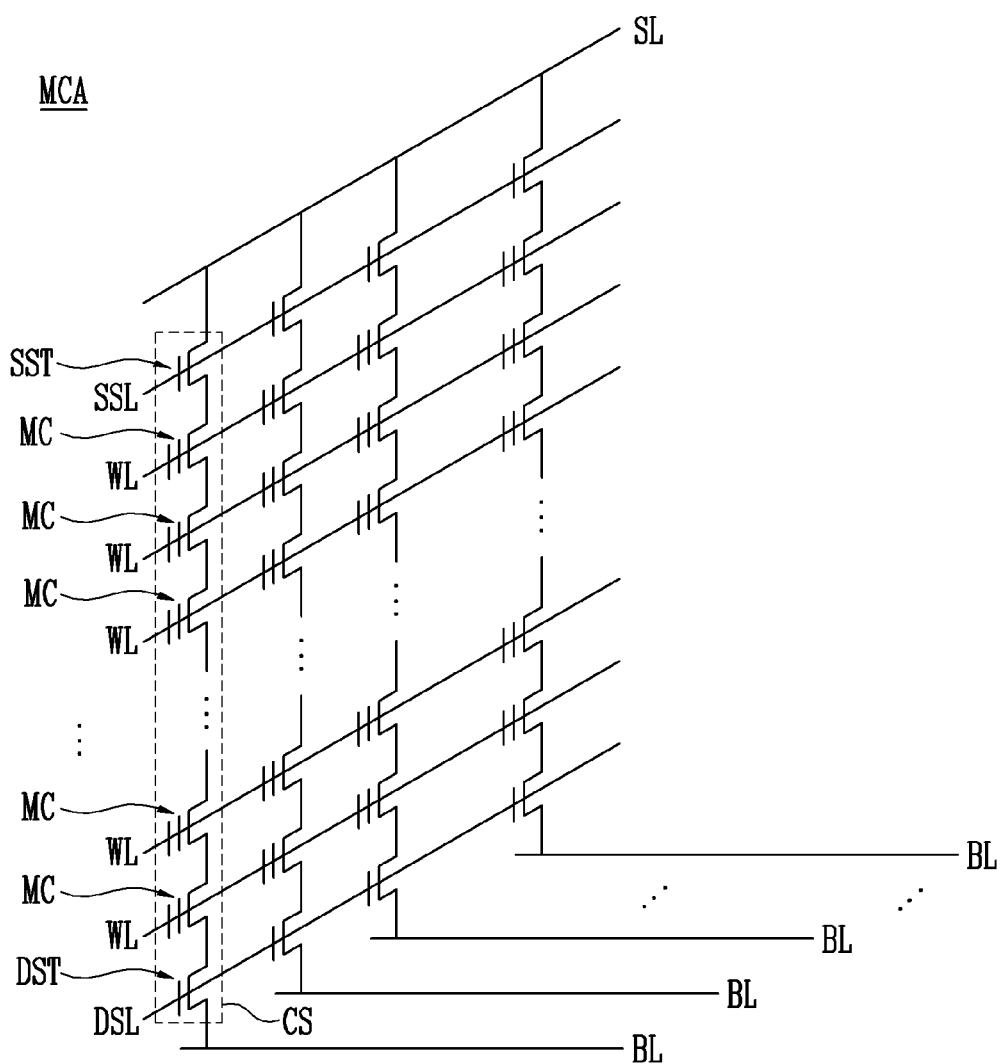
FIG. 2 is a circuit diagram illustrating a memory cell array as shown in FIG. 1.

FIG. 2 is a circuit diagram illustrating the memory cell array MCA as shown in FIG. 1.

Referring to FIG. 2, the memory cell array MCA may include a plurality of memory cell strings CS that are coupled to the plurality of bit lines BL, respectively. The plurality of memory cell strings CS may be coupled in parallel with the source layer SL.

Each of the memory cell strings CS may include one drain select transistor DST, a plurality of memory cells MC, and at least one source select transistor SST.

The plurality of memory cells MC may be coupled in series between the drain select transistor DST and the source select transistor SST. The plurality of memory cells MC may be coupled to the source layer SL through the source select transistor SST. The plurality of memory cells MC may be coupled to a corresponding bit line BL through the drain select transistor DST.

The plurality of memory cells MC may be coupled to a plurality of word lines WL, respectively. Operations of the plurality of memory cells MC may be controlled by gate signals that are applied to the plurality of word lines WL. The drain select transistor DST may be coupled to a drain select line DSL. Operations of the drain select transistor DST may be controlled by a gate signal which is applied to the drain select line DSL. The source select transistor SST may be coupled to a source select line SSL. Operations of the source select transistor SST may be controlled by a gate signal which is applied to the source select line SSL. The source select line SSL, the plurality of word lines WL, and the drain select line DSL may be formed of conductive patterns that are stacked and separated from each other.

Figure 3A:
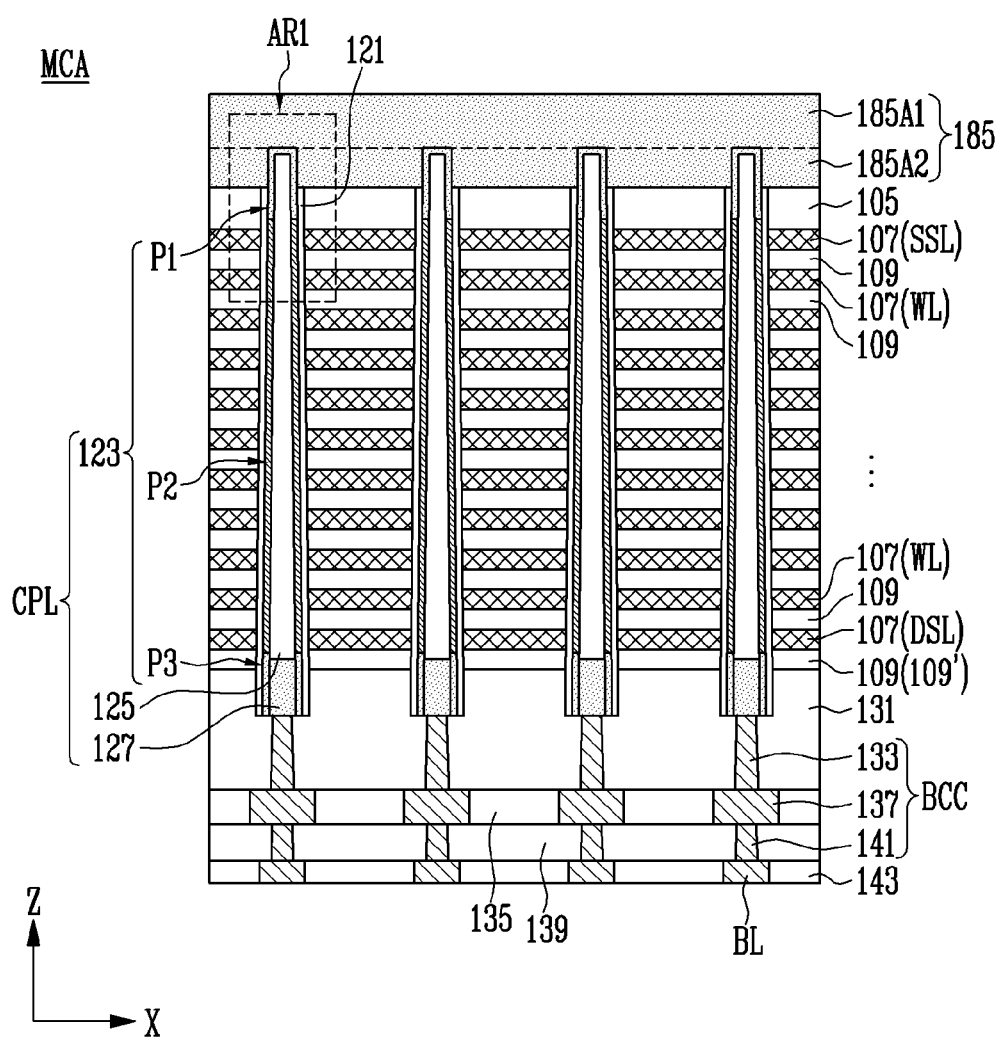
FIGS. 3A and 3B are cross-sectional diagrams illustrating an embodiment of a memory cell array of FIG. 1.
Figure 3B:
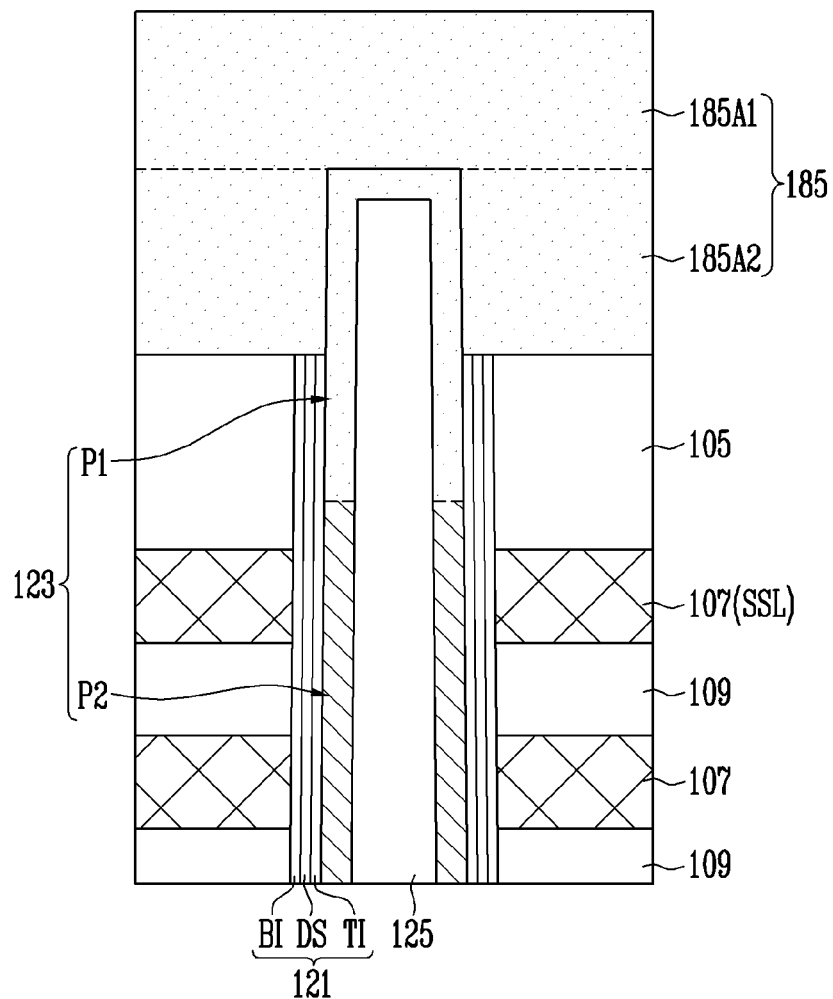

FIGS. 3A and 3B are cross-sectional diagrams illustrating an embodiment of the memory cell array MCA as shown in FIG. 1. More specifically, FIG. 3A is a cross-sectional diagram of the memory cell array MCA taken along a direction crossing the plurality of bit lines BL, and FIG. 3B is an enlarged sectional view of an area AR1 as shown in FIG. 3A.

Referring to FIGS. 3A and 3B, the memory cell array MCA may include a doped semiconductor layer 185, a first interlayer insulating layer 105, a plurality of conductive patterns 107, a plurality of second interlayer insulating layers 109, cell plugs CPL, a memory layer 121, and the bit line BL.

The plurality of conductive patterns 107 and the plurality of second interlayer insulating layers 109 may be arranged alternately with each other under the first interlayer insulating layer 105. The plurality of conductive patterns 107 and the plurality of second interlayer insulating layers 109 may be arranged between the first interlayer insulating layer 105 and the bit line BL, and may be arranged alternately with each other in a Z-axis direction.

The first interlayer insulating layer 105 and each of the second interlayer insulating layers 109 may include the same insulating material. According to an embodiment, the first interlayer insulating layer 105 and the second interlayer insulating layer 109 may include silicon oxide.

The plurality of conductive patterns 107 may be insulated from the doped semiconductor layer 185 by the first interlayer insulating layer 105. The plurality of conductive patterns 107 may be insulated from each other by the plurality of second interlayer insulating layers 109. At least one conductive pattern which is adjacent to the doped semiconductor layer 185, among the plurality of conductive patterns 107, may serve as the source select line SSL described above with reference to FIG. 2. At least one conductive pattern which is adjacent to the bit line BL, among the plurality of conductive patterns 107, may serve as the drain select line DSL as described above with reference to FIG. 2. Conductive patterns arranged between the conductive pattern serving as the source select line SSL, among the plurality of conductive patterns 107, and the conductive pattern serving as the drain select line DSL may serve as the word lines WL as described above with reference to FIG. 2.

The doped semiconductor layer 185 may form the source layer SL as shown in FIGS. 1 and 2. The doped semiconductor layer 185 may include a crystalline area 185A1 and an amorphous area 185A2. The amorphous area 185A2 may be arranged between the crystalline area 185A1 and the first interlayer insulating layer 105. The crystalline area 185A1 may overlap the first interlayer insulating layer 105 with the amorphous area 185A2 interposed therebetween. The doped semiconductor layer 185 may include a semiconductor material such as silicon or germanium. The doped semiconductor layer 185 may include at least one of n-type impurities and p-type impurities. According to an embodiment, each of the crystalline area 185A1 and the amorphous area 185A2 of the doped semiconductor layer 185 may include n-type impurities as majority carriers. However, the present disclosure is not limited thereto. For example, the doped semiconductor layer 185 may include an n-type impurity region and a p-type impurity region. According to an embodiment, the amorphous area 185A2 of the doped semiconductor layer 185 may include n-type impurities as majority carriers, and the crystalline area 185A1 of the doped semiconductor layer 185 may include p-type impurities as majority carriers.

The memory cell array MCA may include a first insulating layer 131 which is arranged between a stacked structure which includes the plurality of conductive patterns 107 and the plurality of second interlayer insulating layers 109, and the bit line BL.

The cell plug CPL may include a channel layer 123. The channel layer 123 may pass through the first interlayer insulating layer 105, the plurality of conductive patterns 107, and the plurality of second interlayer insulating layers 109. The channel layer 123 may contact the doped semiconductor layer 185. According to an embodiment, the channel layer 123 may extend into the amorphous area 185A2 of the doped semiconductor layer 185. The channel layer 123 may extend into the first insulating layer 131. The channel layer 123 may include a semiconductor material such as silicon. The channel layer 123 may include a first portion P1, a second portion P2, and a third portion P3. The first portion P1 may be defined as a portion adjacent to the doped semiconductor layer 185, the third portion P3 may be defined as a portion adjacent to the bit line BL, and the second portion P2 may be defined as a portion which is arranged between the first portion P1 and the third portion P3.

The third portion P3 of the channel layer 123 may include first conductivity type impurities. According to an embodiment, the first conductivity type impurities may be n-type impurities. The first portion P1 of the channel layer 123 may include second conductivity type impurities. The second conductivity type impurities may be the same as the impurities in the doped semiconductor layer 185. The second conductivity type impurities may be the same as the first conductivity type impurities. According to an embodiment, the second conductivity type impurities may be n-type impurities. The second portion P2 of the channel layer 123 may be a channel region and may be distinct from a doping state of each of the first portion P1 and the second portion P2. According to an embodiment, the second portion P2 of the channel layer 123 may be substantially an intrinsic region.

According to an embodiment, the first portion P1 of the channel layer 123 which forms a doping region may be distributed up to a level where the first interlayer insulating layer 105 is arranged. The third portion P3 of the channel layer 123 which forms the doping region may be distributed up to a level where a second interlayer insulating layer 109' which is adjacent to the first insulating layer 131, among the second interlayer insulating layers 109, is arranged. However, the present disclosure is not limited thereto. The distribution ranges of the first portion P1 and the second portion P2 of the channel layer 123 in the Z-axis direction may be designed in various manners according to design rules of the semiconductor memory device.

The channel layer 123 may have various shapes. According to an embodiment, the channel layer 123 may be formed in a tubular shape. The cell plug CPL may further include a core insulating layer 125 and a capping pattern 127 which are arranged at the central area of the tubular channel layer 123. The capping pattern 127 may include a semiconductor material such as silicon. The capping pattern 127 may be surrounded by the third portion P3 of the channel layer 123 and include the same impurities as the third portion P3 of the channel layer 123. The core insulating layer 125 may be arranged between the capping pattern 127 and the doped semiconductor layer 185. The core insulating layer 125 may include an area surrounded by the first portion P1 of the channel layer 123 and the second portion P2 of the channel layer 123. The first portion P1 of the channel layer 123 may extend along the surface of the core insulating layer 125 facing the doped semiconductor layer 185. Therefore, the core insulating layer 125 may be separated from the doped semiconductor layer 185 by the first portion P1 of the channel layer 123.

A boundary between the crystalline area 185A1 and the amorphous area 185A2 may be arranged at a level where an end of the first portion P1 of the channel layer 123 toward the Z-axis is arranged. However, the present disclosure is not limited thereto. The level at which the boundary between the crystalline area 185A1 and the amorphous area 185A2 of the doped semiconductor layer 185 is arranged may vary. For example, the boundary between the crystalline area 185A1 and the amorphous area 185A2 of the doped semiconductor layer 185 may be located at a lower or higher level than the end of the first portion P1.

The memory layer 121 may be arranged between each of the conductive patterns 107 and the channel layer 123. According to an embodiment, the memory layer 121 may extend between each of the first and second interlayer insulating layers 105 and 109 and the channel layer 123. However, the present disclosure is not limited thereto. According to an embodiment, the memory layer 121 may extend between each of the first and second interlayer insulating layers 105 and 109, and the conductive pattern 107 adjacent thereto.

The memory layer 121 may include a blocking insulating layer BI, a data storage layer DS and a tunnel insulating layer TI. The blocking insulating layer BI may include a metal oxide layer, a silicon oxide layer, and the like. The data storage layer DS may include a material layer capable of storing varying data using Fowler-Nordheim tunneling. The material layer may include a nitride layer which enables charge trapping. However, embodiments of the present disclosure are not limited thereto. For example, the data storage layer DS may include nano dots. The tunnel insulating layer TI may include an insulating material that enables charge tunneling. According to an embodiment, the tunnel insulating layer TI may include a silicon oxide layer. The blocking insulating layer BI may extend along a sidewall of the channel layer 123. The data storage layer DS may be arranged between the blocking insulating layer BI and the channel layer 123. The tunnel insulating layer TI may be arranged between the data storage layer DS and the channel layer 123.

The memory cell array MCA may further include at least one insulating layer which is arranged between the first insulating layer 131 and the bit line BL. According to an embodiment, the memory cell array MCA may include a second insulating layer 135 between the first insulating layer 131 and the bit line BL, and a third insulating layer 139 between the second insulating layer 135 and the bit line BL. The bit line BL may pass through a fourth insulating layer 143 that overlaps the third insulating layer 139. The bit line BL may be coupled to the capping pattern 127 of the cell plug CPL through a bit line-channel connecting structure BCC. The bit line-channel connecting structure BCC may include conductive patterns having various structures. According to an embodiment, the bit line-channel connecting structure BCC may include a first conductive plug 133 which extends from the capping pattern 127 to pass through the first insulating layer 131, a conductive pad 137 which extends from the first conductive plug 133 to pass through the second insulating layer 135, and a second conductive plug 141 which extends from conductive pad 137 to pass through the third insulating layer 139.

Figure 4:
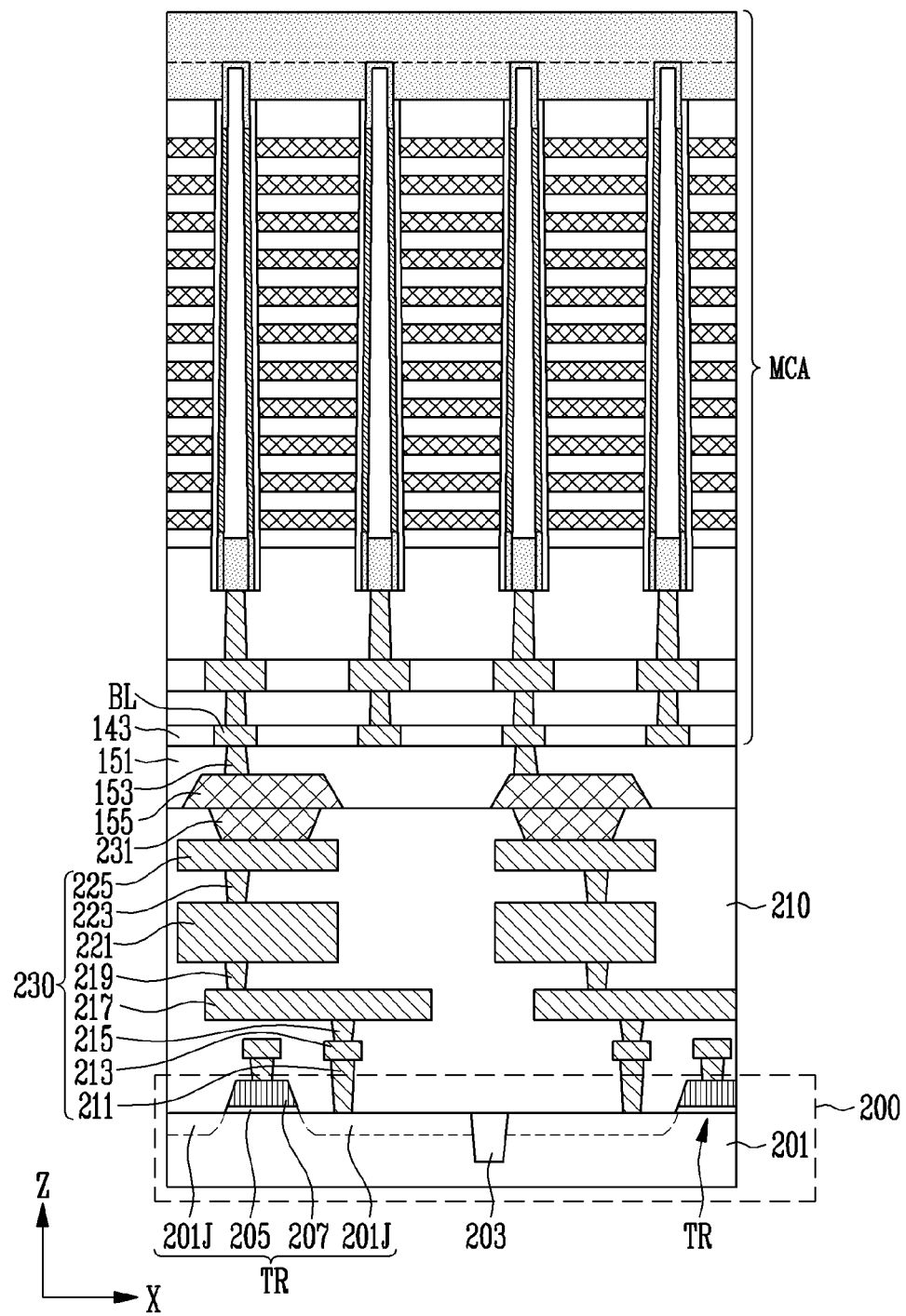
FIG. 4 is a cross-sectional diagram illustrating a semiconductor memory device according to an embodiment of the present disclosure.

FIG. 4 is a cross-sectional diagram illustrating a semiconductor memory device according to an embodiment of the present disclosure.

Referring to FIG. 4, the semiconductor memory device may include the memory cell array MCA, a peripheral circuit structure 200, a first interconnection 153, a second interconnection 230, a first conductive bonding pad 155, and a second conductive bonding pad 231. The peripheral circuit structure 200, the first interconnection 153, the second interconnection 230, the first conductive bonding pad 155, and the second conductive bonding pad 231 may be arranged under the memory cell array MCA. The memory cell array MCA may be the same as described above with reference to FIGS. 3A and 3B.

The first interconnection 153 and the second interconnection 230 may be coupled to each other by a connection structure of the first conductive bonding pad 155 and the second conductive bonding pad 231. According to an embodiment, the first conductive bonding pad 155 and the second conductive bonding pad 231 may be coupled to each other by a bonding process.

The peripheral circuit structure 200 may include a substrate 201 and a plurality of transistors TR. The substrate 201 may be a semiconductor substrate which includes silicon or germanium. The substrate 201 may include active regions which are divided by isolation layers 203.

The plurality of transistors TR may form a peripheral circuit for controlling the operations of the memory cell array MCA. According to an embodiment, the plurality of transistors TR may include a transistor of a page buffer circuit for controlling the bit line BL. Each of the plurality of transistors TR may include a gate insulating layer 205, a gate electrode 207, and junctions 2013. The gate insulating layer 205 and the gate electrode 207 may be stacked on the active region of the substrate 201. The junctions 2013 may be provided as a source region and a drain region. The junctions 2013 may be provided by doping the active region exposed at both sides of the gate electrode 207 with at least one of n-type impurities and p-type impurities.

The first interconnection 153 and the first conductive bonding pad 155 may be formed in a cell array-side insulating structure 151. The cell array-side insulating structure 151 may include insulating layers in a double-layer or multiple-layer structure. The first interconnection 153 may include conductive patterns having various structures. The first conductive bonding pad 155 may be coupled to the bit line BL of the memory cell array MCA through the first interconnection 153.

The second interconnection 230 and the second conductive bonding pad 231 may be formed in a peripheral circuit-side insulating structure 210. The peripheral circuit-side insulating structure 210 may include insulating layers in a double-layer or multiple-layer structure. The second interconnection 230 may include a plurality of conductive patterns 211, 213, 215, 217, 219, 221, 223, and 225 which are coupled to the transistor TR. The plurality of conductive patterns 211, 213, 215, 217, 219, 221, 223, and 225 may have various structures. The second conductive bonding pad 231 may be coupled to the transistor TR through the second interconnection 230.

According to the above-described structure, the bit line BL may be coupled to the transistor TR through the first interconnection 153, the first conductive bonding pad 155, the second conductive bonding pad 231, and the second interconnection 230.

Figure 5:
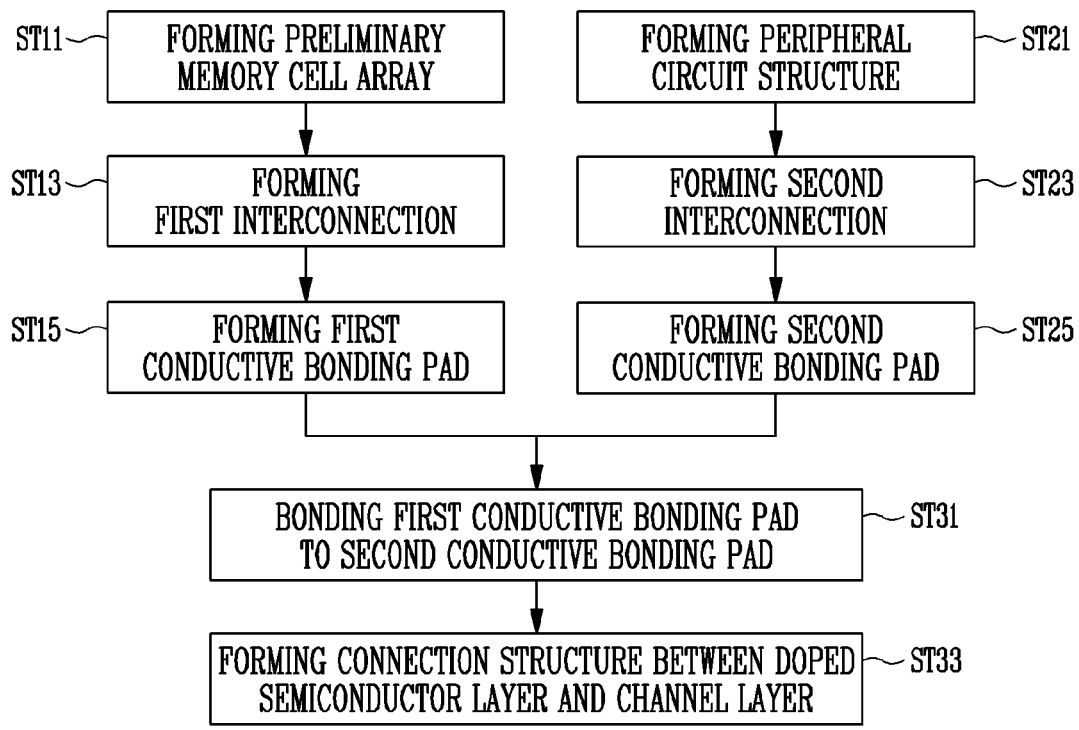
FIG. 5 is a flowchart illustrating a method of manufacturing a semiconductor memory device according to an embodiment of the present disclosure.

FIG. 5 is a flowchart illustrating a method of manufacturing a semiconductor memory device according to an embodiment of the present disclosure.

Referring to FIG. 5, a method of manufacturing a semiconductor memory device may include forming a preliminary memory cell array structure at step ST11, forming a first interconnection at step ST13, forming a first conductive bonding pad at step ST15, forming a peripheral circuit at step ST21, forming a second interconnection at step ST23, forming a second conductive bonding pad at ST25, bonding the first conductive bonding pad to the second conductive bonding pad at step ST31, and forming a connection structure between a doped semiconductor layer and a channel layer at step ST33.

Steps ST11 and ST21 may be performed independently of each other. Therefore, deterioration of electrical characteristics of the peripheral circuit structure caused by high temperature required at step ST11 may be fundamentally blocked.

To maintain the electrical characteristics of the peripheral circuit structure, step ST33 may be performed by a method at low temperature within a short time. According to an embodiment, step ST33 may be performed using an excimer laser annealing method. An excimer laser annealing process may be performed in consideration of surface roughness variation and impurity diffusion.

Figure 6:
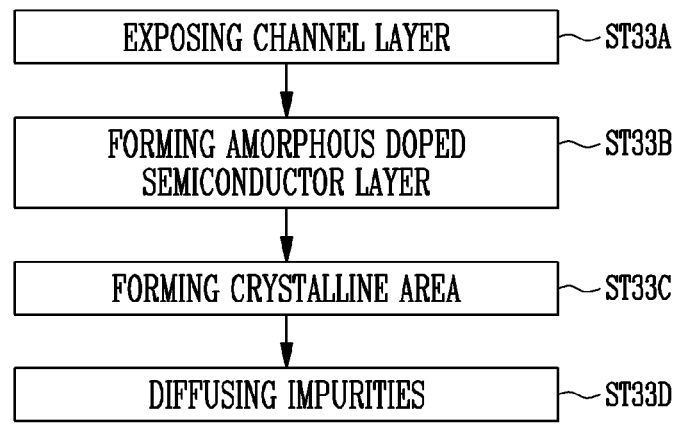
FIG. 6 is a flowchart illustrating step ST33 shown in FIG. 5.

FIG. 6 is a flowchart illustrating step ST33 shown in FIG. 5.

Referring to FIG. 6, step ST33 may include exposing a channel layer at step ST33A, forming an amorphous doped semiconductor layer at step ST33B, forming a crystalline area at step ST33C, and diffusing impurities at step ST33D. Step ST33A may include at least one of selective etching and chemical mechanical polishing (CMP). Step ST33B may be performed so that an amorphous doped semiconductor layer may contact the channel layer exposed at step ST33A. Steps ST33C and ST33D may be performed by the above-described excimer laser annealing method. Steps ST33C and ST33D may be performed using a laser beam having different energy densities.

Hereinafter, a method of manufacturing a semiconductor memory device according to an embodiment of the present disclosure will be described with reference to cross-sectional diagrams illustrating manufacturing processes.

FIGS. 7A, 7B, 7C, and 7D are cross-sectional diagrams illustrating an embodiment of part of a method of manufacturing a semiconductor memory device as shown in FIG. 5.

Figure 7A:
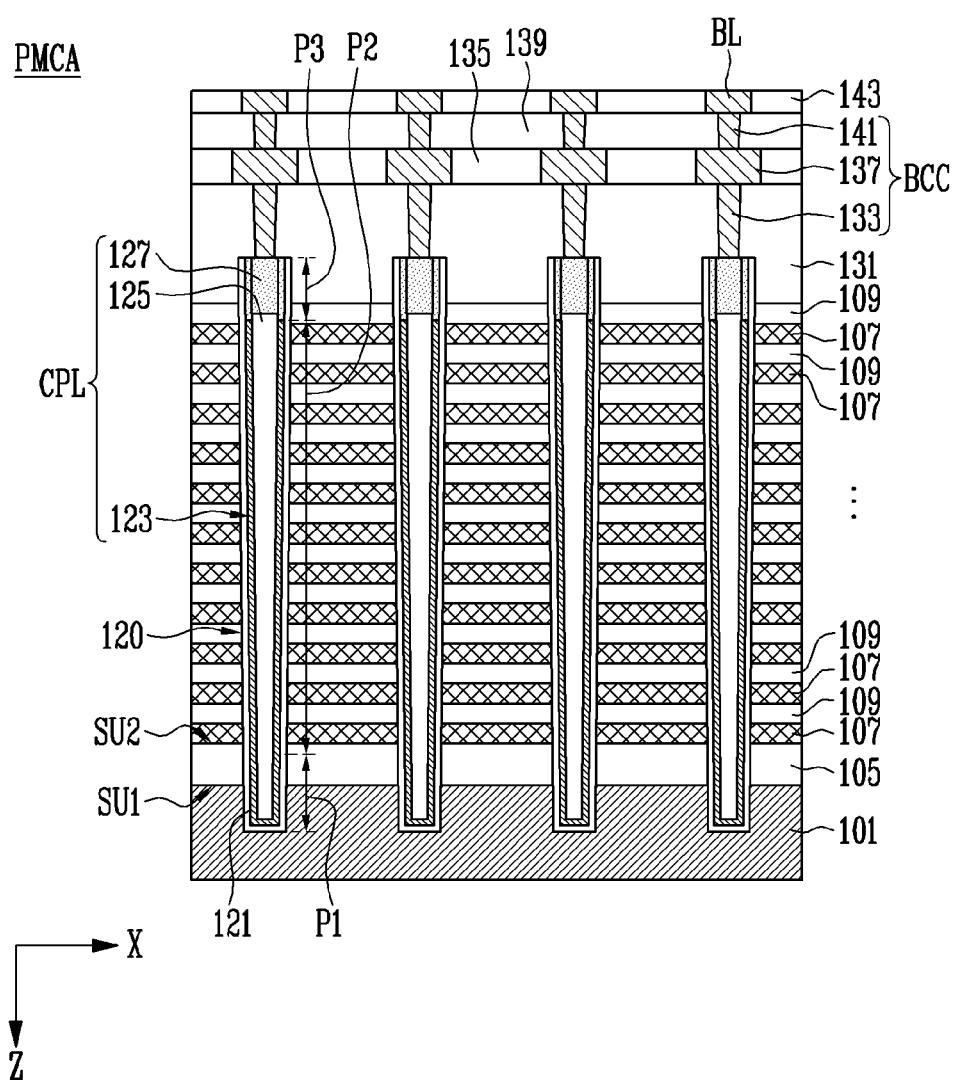
FIGS. 7A, 7B, 7C, and 7D are cross-sectional diagrams illustrating an embodiment of part of a method of manufacturing a semiconductor memory device as shown in FIG. 5.

FIG. 7A is a cross-sectional diagram illustrating an embodiment of step ST11 shown in FIG. 5.

Referring to FIG. 7A, a preliminary memory cell array structure PMCA may be formed over a substrate 101 at step ST11. However, embodiments of the present disclosure are not limited thereto. For example, after an etch stop layer (not shown) is formed over the substrate 101, the preliminary memory cell array structure PMCA may be formed on the etch stop layer. The substrate 101 may include silicon. The etch stop layer may include a material having an etch selectivity with respect to silicon, for example, nitride.

The preliminary memory cell array structure PMCA may include the first interlayer insulating layer 105, the plurality of conductive patterns 107, the plurality of second interlayer insulating layers 109, the cell plug CPL, the memory layer 121, and the bit line BL.

The first interlayer insulating layer 105 may be formed over the substrate 101. The first interlayer insulating layer 105 may include a first surface SU1 which faces the substrate 101 and a second surface SU2 which faces in an opposite direction to the direction toward the substrate 101. The plurality of conductive patterns 107 and the plurality of second interlayer insulating layers 109 may be stacked alternately on the second surface SU2 of the first interlayer insulating layer 105.

The cell plug CPL may include the channel layer 123 that passes through the first interlayer insulating layer 105, the plurality of conductive patterns 107, and the plurality of second interlayer insulating layers 109. As described above with reference to FIGS. 3A and 3B, the channel layer 123 may have a tubular shape and the cell plug CPL may further include the core insulating layer 125 and the capping pattern 127 that fill the central area of the tubular channel layer 123. The channel layer 123 and the core insulating layer 125 of the cell plug CPL may pass through the first surface SU1 of the first interlayer insulating layer 105 and may extend into the substrate 101.

The memory layer 121 may pass through the first interlayer insulating layer 105, the plurality of conductive patterns 107, and the plurality of second interlayer insulating layers 109. The memory layer 121 may pass through the first surface SU1 of the first interlayer insulating layer 105 and extend into the substrate 101. The memory layer 121 may extend along a sidewall and a bottom surface of the channel layer 123 and include the blocking insulating layer BI, the data storage layer DS, and the tunnel insulating layer TI as shown in FIG. 3B.

The first interlayer insulating layer 105, the plurality of conductive patterns 107, the plurality of second interlayer insulating layers 109, the memory layer 121, and the cell plug CPL may be formed through a plurality of processes. Hereinafter, the structure which includes the first interlayer insulating layer 105, the plurality of conductive patterns 107, the plurality of second interlayer insulating layers 109, the memory layer 121, and the cell plug CPL may be defined as a preliminary memory cell string structure.

According to an embodiment, forming the preliminary memory cell string structure may include stacking a plurality of first material layers and a plurality of second material layers stacked alternately with each other on the first interlayer insulating layer 105, forming a hole 120, forming the memory layer 121, and forming the cell plug CPL.

The first material layers and the second material layers may be different from each other. According to an embodiment, the first material layer may include a conductive material for the conductive pattern 107, and the second material layer may include an insulating material for the second interlayer insulating layer 109. According to another embodiment, the first material layer may include a sacrificial material and the second material layer may include an insulating material for the second interlayer insulating layer 109. For example, the sacrificial material may include nitride and the second interlayer insulating layer 109 may include oxide.

Forming the hole 120 may include etching the plurality of first material layers and the plurality of second material layers through an etch process using a mask pattern (not shown) as an etch barrier, and etching the substrate 101. As a result, the hole 120 may extend into the substrate 101. The memory layer 121 may be formed along the surface of the hole 120. Forming the cell plug CPL may include forming the channel layer 123 on the memory layer 121 and filling a central area of the hole 120 with the core insulating layer 125 and the capping pattern 127. The channel layer 123 may include a semiconductor material such as silicon. The channel layer 123 may include the first portion P1, the second portion P2 and the third portion P3. The first portion P1 may correspond to a portion of the channel layer 123 which is adjacent to the first interlayer insulating layer 105. The third portion P3 may be an end of the channel layer 123 which faces in a direction opposite to the direction towards the semiconductor substrate 101. The second portion P2 may be defined as another portion of the channel layer 123 between the first portion P1 and the third portion P3.

In the preliminary memory cell array structure PMCA, each of the first portion P1 and the second portion P2 of the channel layer 123 may be substantially an intrinsic region. For example, in the preliminary memory cell array structure PMCA, each of the first portion P1 and the second portion P2 of the channel layer 123 may be an undoped region. The core insulating layer 125 may have a smaller height than the channel layer 123. As described above with reference to FIGS. 3A and 3B, the capping pattern 127 may include a semiconductor material which includes impurities. The impurities in the capping pattern 127 may be diffused into the third portion P3 of the channel layer 123 from the sidewall of the channel layer 123 which contacts the capping pattern 127. As a result, the third portion P3 of the channel layer 123 may be defined as a doping region.

After the cell plug CPL is formed, the above-described mask pattern (not shown) may be removed and the first insulating layer 131 may fill the region from which the mask pattern is removed. The cell plug CPL may be covered by the first insulating layer 131. When the first material layer and the second material layer include a conductive material for the conductive pattern 107 and an insulating material for the second interlayer insulating layer 109, the first material layer and the second material layer may remain as the conductive pattern 107 and the second interlayer insulating layer 109, respectively, which surround the cell plug CPL. When the first material and the second material include a sacrificial material and an insulating material for the second interlayer insulating layer 109, forming the preliminary memory cell string structure may further include replacing the first material layer including the sacrificial material with the conductive pattern 107.

After the preliminary memory cell string is formed, the bit line BL which is electrically coupled to the cell plug CPL may be formed. The bit line BL may be coupled to the capping pattern 127 of the cell plug CPL through the bit line-channel connecting structure BCC.

According to an embodiment, forming the bit line-channel connecting structure BCC may include forming the first conductive plug 133 which passes through the first insulating layer 131, forming the second insulating layer 135 which covers the first conductive plug 133 and the first insulating layer 131, forming the conductive pad 137 which passes through the second insulating layer 135, forming the third insulating layer 139 which covers the conductive pad 137 and the second insulating layer 135, and forming the second conductive plug 141 which passes through the third insulating layer 139.

According to an embodiment, forming the bit line BL may include forming the fourth insulating layer 143 which covers the second conductive plug 141 and the third insulating layer 139, forming a trench which passes through the fourth insulating layer 143 and exposes the bit line-channel connecting structure BCC, and filling the trench with a conductive material.

Figure 7B:
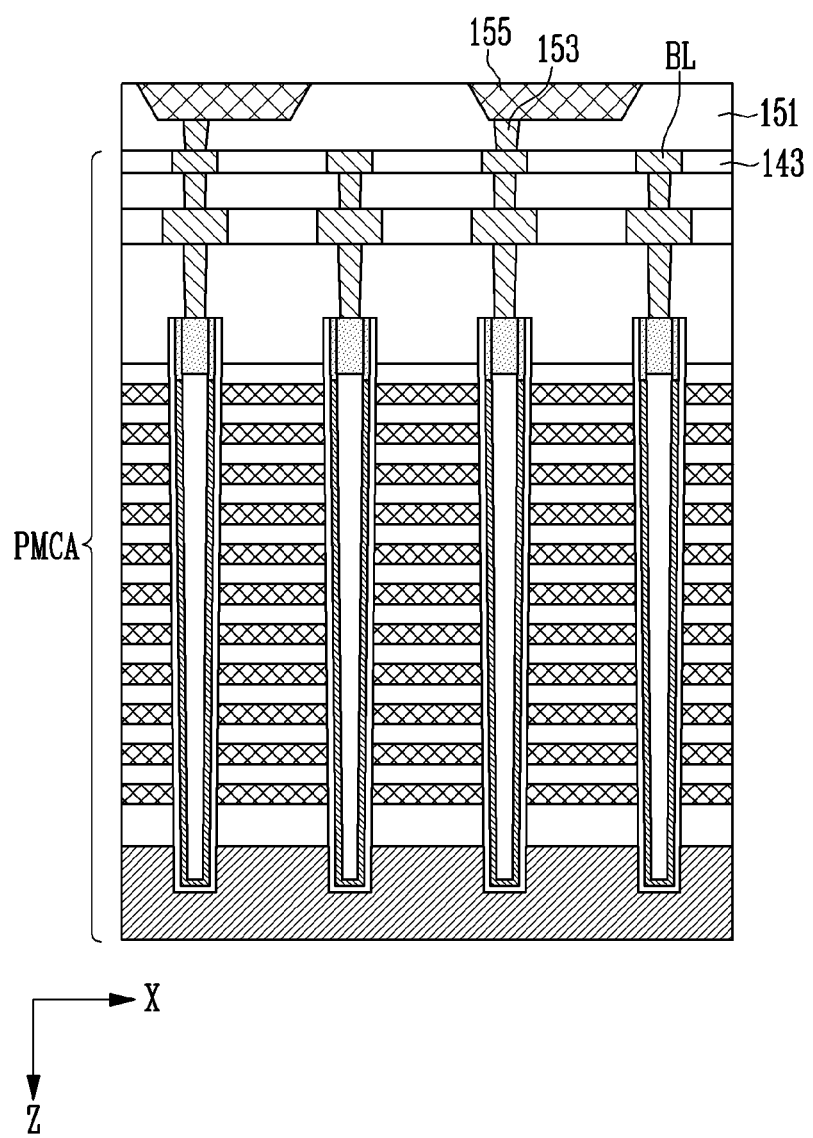

FIG. 7B is a cross-sectional diagram illustrating an embodiment of steps ST13 and ST15 as shown in FIG. 5.

Referring to FIG. 7B, the cell array-side insulating structure 151, the first interconnection 153, and the first conductive bonding pad 155 may be formed through steps ST13 and ST15. The cell array-side insulating structure 151 may be formed on the preliminary memory cell array structure PMCA. The first interconnection 153 and the first conductive bonding pad 155 may be embedded in the cell array-side insulating structure 151.

According to an embodiment, step ST13 may include forming a lower insulating layer of the cell array-side insulating structure 151 and the first interconnection 153 passing through the lower insulating layer. According to an embodiment, step ST15 may include forming an upper insulating layer of the cell array-side insulating structure 151 on the lower insulating layer and forming the first conductive bonding pad 155 passing through the upper insulating layer.

Figure 7C:
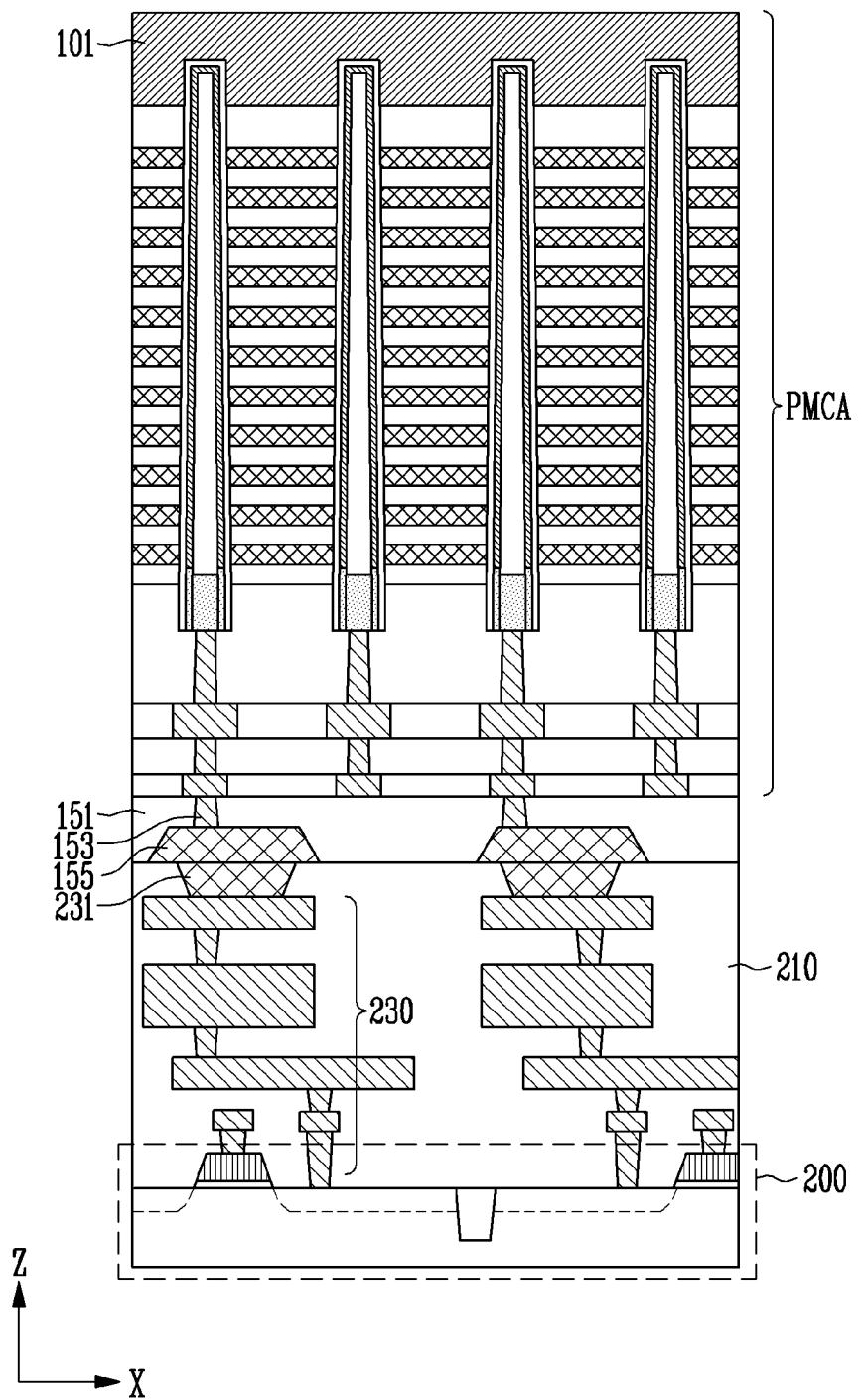

FIG. 7C is a cross-sectional diagram illustrating examples of steps ST21, ST23, ST25, and ST31 as shown in FIG. 5.

Referring to FIG. 7C, the peripheral circuit structure 200 as described above with reference to FIG. 4 may be formed at step ST21. In addition, the peripheral circuit-side insulating structure 210, the second interconnection 230, and the second conductive bonding pad 231 may be formed at steps ST23 and ST25. The peripheral circuit-side insulating structure 210 may cover the peripheral circuit structure 200. The second interconnection 230 and the second conductive bonding pad 231 may be embedded in the peripheral circuit-side insulating structure 210.

Subsequently, the first conductive bonding pad 155 which is provided by the processes as described with reference to FIGS. 7A and 7B may be bonded to the second conductive bonding pad 231 at step ST31. In addition, the peripheral circuit-side insulating structure 210 may be bonded to the cell array-side insulating structure 151.

Figure 7D:
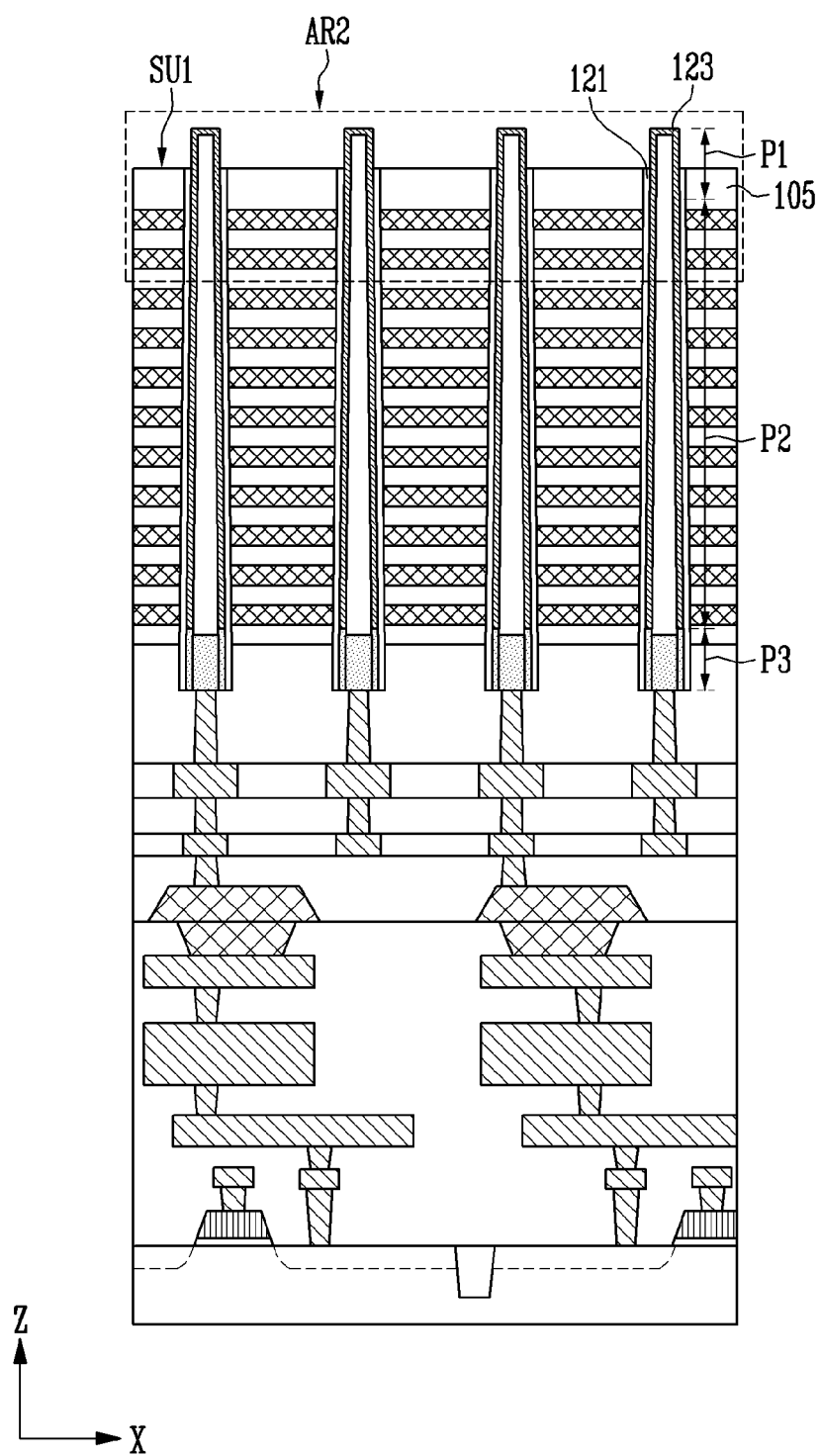

FIG. 7D is a cross-sectional diagram illustrating an embodiment of step ST33A as shown in FIG. 6.

Referring to FIG. 7D, step ST33A may include selectively removing the substrate 101 as shown in FIG. 7C and selectively removing a portion of the memory layer 121. As a result, the first portion P1 of the channel layer 123 may be exposed. By selectively removing the substrate 101 and the memory layer 121, the first portion P1 of the channel layer 123 may remain and protrude above the first surface SU1 of the first interlayer insulating layer 105.

Figure 8A:
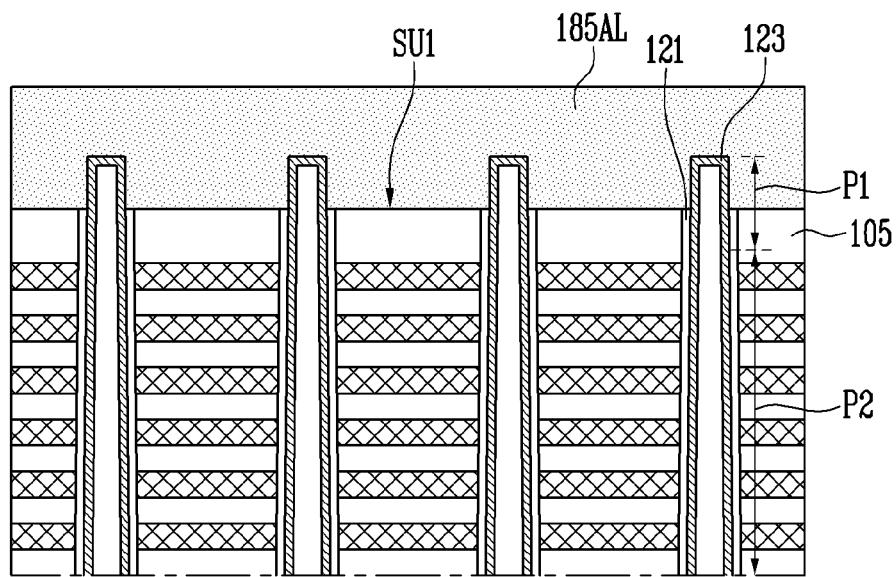
FIGS. 8A, 8B, and 8C are cross-sectional diagrams illustrating an embodiment of subsequent processes of an area AR2 as shown in FIG. 7D.
Figure 8B:
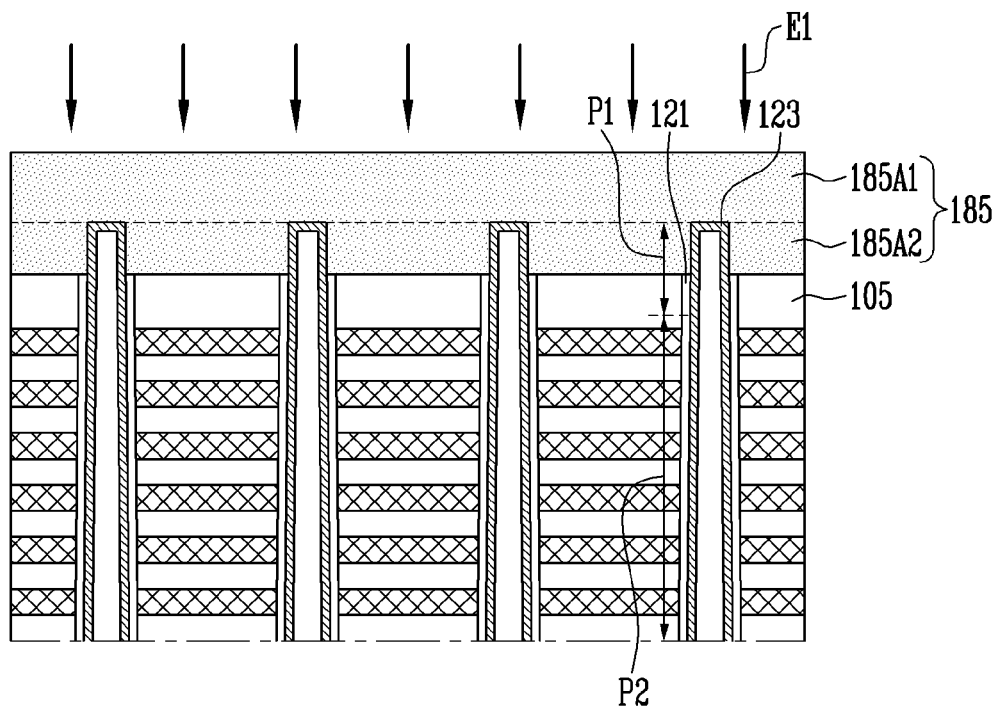
Figure 8C:
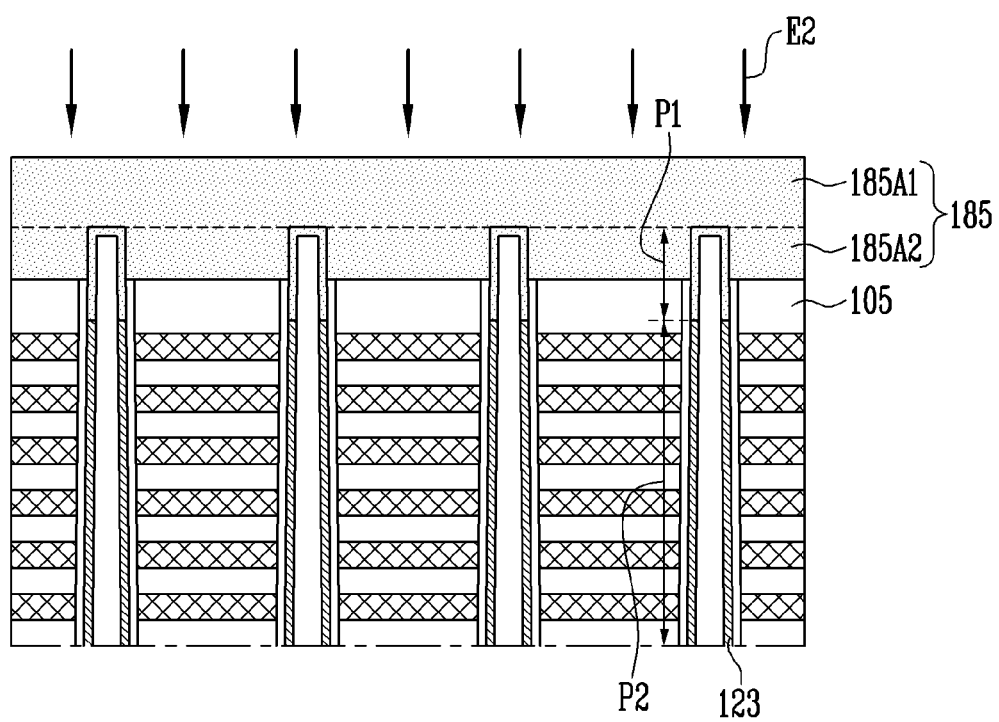

FIGS. 8A, 8B, and 8C are cross-sectional diagrams illustrating subsequent processes of an area AR2 as shown in FIG. 7D.

FIG. 8A is a cross-sectional diagram illustrating an embodiment of step ST33B shown in FIG. 6.

Referring to FIG. 8A, at step ST33B, an amorphous doped semiconductor layer 185AL may be formed on the first surface SU1 of the first interlayer insulating layer 105. The amorphous doped semiconductor layer 185AL may include at least one of n-type impurities and p-type impurities. According to an embodiment, the amorphous doped semiconductor layer 185AL may include n-type impurities.

The amorphous doped semiconductor layer 185AL may contact the first portion P1 of the channel layer 123.

FIG. 8B is a cross-sectional diagram illustrating an embodiment of step ST33C shown in FIG. 6.

Referring to FIG. 8B, the crystalline area 185A1 may be defined by crystallizing the surface of the amorphous doped semiconductor layer 185AL as shown in FIG. 8A. The crystallization of the surface of the amorphous doped semiconductor layer 185AL may be performed by irradiating a laser beam having a first energy density E1 onto the surface of the amorphous doped semiconductor layer 185AL as shown in FIG. 8A. The first energy density E1 may be controlled to be lower than an energy density for melting the amorphous doped semiconductor layer 185AL as shown in FIG. 8A. Unlike an embodiment of the present disclosure, when a laser beam having a high energy density which is high enough to melt an amorphous doped semiconductor layer is irradiated onto the amorphous doped semiconductor layer, surface roughness of the amorphous doped semiconductor layer may be increased by unevenness defined by the first portion P1 of the channel layer 123 and the first interlayer insulating layer 105. According to an embodiment of the present teachings, however, the above-described increase in surface roughness may be avoided by forming the crystalline area 185A1 using the laser beam having the first energy density E1 which may prevent the melting of the amorphous doped semiconductor layer 185AL as shown in FIG. 8A.

At step ST33C, an irradiation range of the laser beam may be controlled so that the amorphous area 185A2 may remain between the crystalline area 185A1 and the first interlayer insulating layer 105.

As a result of step ST33C as described above, the doped semiconductor layer 185 which includes the crystalline area 185A1 and the amorphous area 185A2 may be defined.

FIG. 8C is a cross-sectional diagram illustrating an embodiment of step ST33D shown in FIG. 6.

Referring to FIG. 8C, at step ST33D, impurities in the doped semiconductor layer 185 may be diffused into the first portion P1 of the channel layer 123. Step ST33D may be performed by irradiating a laser beam having a second energy density E2 onto the doped semiconductor layer 185. By the irradiation of the laser beam having the second energy density, the impurities in the doped semiconductor layer 185 may be activated and diffused into the first portion P1 of the channel layer 123. As a result of step ST33D, the first portion P1 of the channel layer 123 may be defined as a doping region. The second energy density E2 may be controlled to be greater than the first energy density E1 so as to activate and diffuse the impurities in the doped semiconductor layer 185. According to an embodiment, the second energy density E2 may be greater than the energy density for melting the amorphous area 185A2 of the doped semiconductor layer 185. The amorphous area 185A2 may be melted at step ST33D.

The second energy density E2 may be controlled to be lower than the energy density for melting the crystalline area 185A1 of the doped semiconductor layer 185. According to an embodiment of the present disclosure, even when the amorphous area 185A2 is melted, the surface of the doped semiconductor layer 185 may have a stabilized state by the crystalline area 185A1. Thus, the surface roughness of the doped semiconductor layer 185 may be improved. As the surface of the doped semiconductor layer 185 is planarized, the impurities in the doped semiconductor layer 185 may be controlled to have a uniform diffusion depth. Therefore, according to an embodiment of the present disclosure, the doping region of the channel layer 123 may be controlled so as to be uniform to thereby improve electrical characteristics of the channel layer 123.

By the processes as described above with reference to FIGS. 7D and 8A to 8C, the doped semiconductor layer 185 may contact the third portion P3 which forms the doping region of the channel layer 123.

Selectively, p-type impurities may be injected into the crystalline area 185A1 of the doped semiconductor layer 185.

Figure 9A:
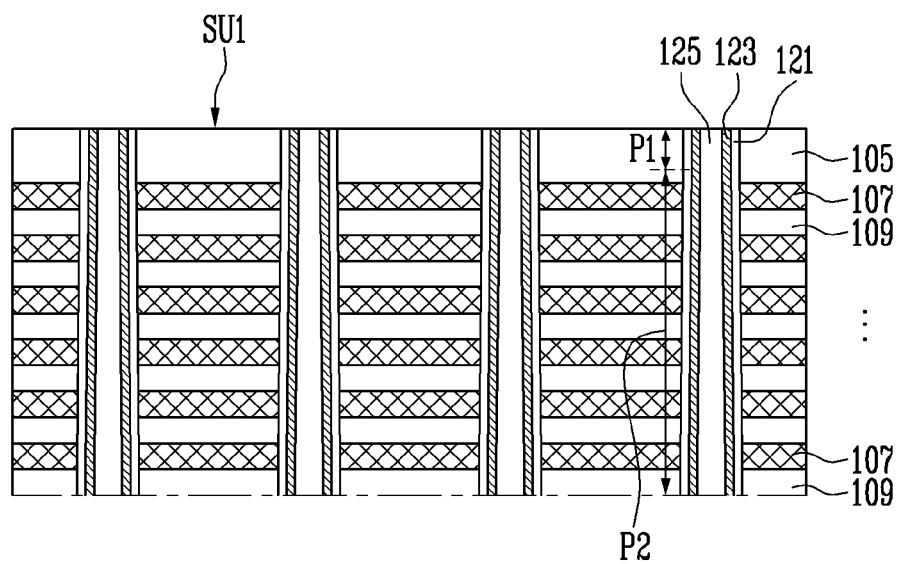
FIGS. 9A, 9B, and 9C are cross-sectional diagrams illustrating an embodiment of step ST33 as shown in FIG. 5.
Figure 9B:
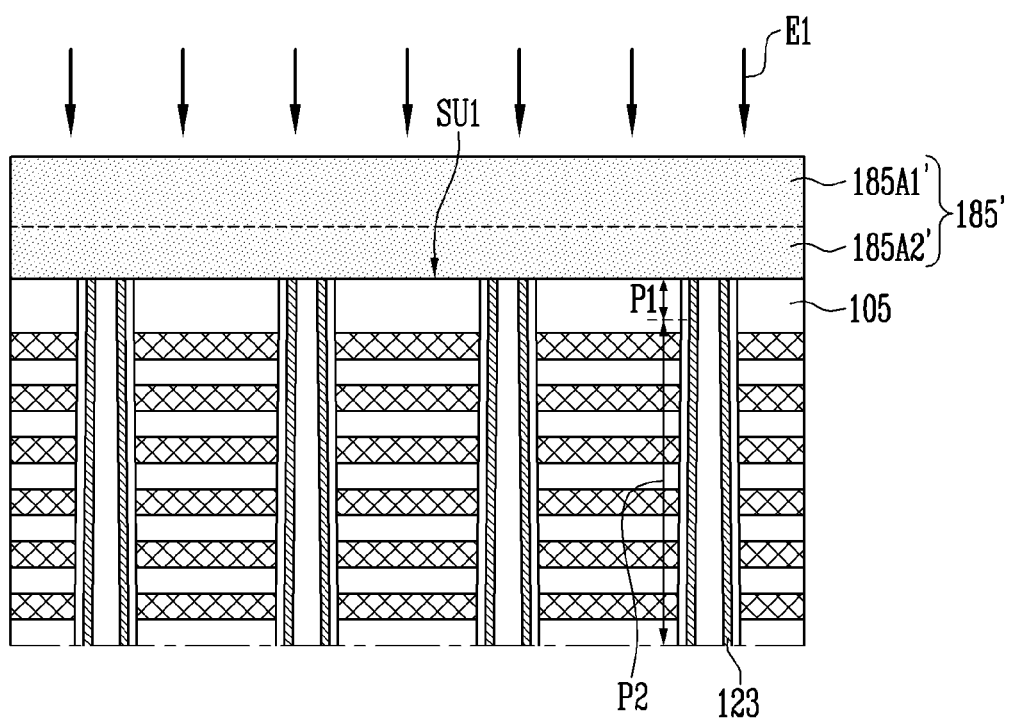
Figure 9C:
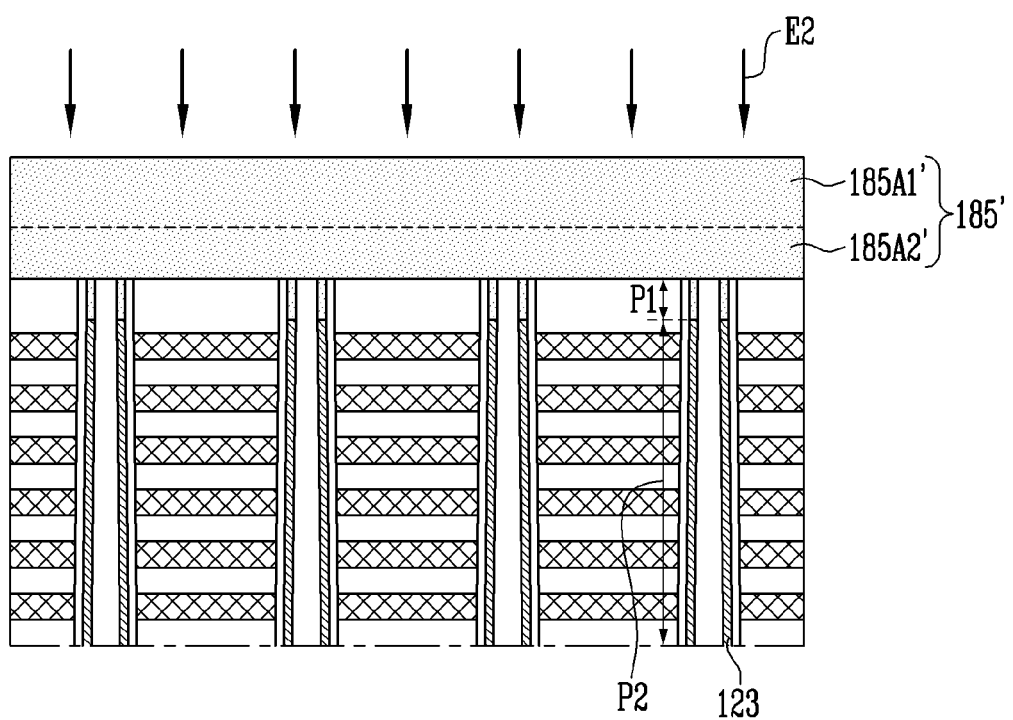

FIGS. 9A, 9B, and 9C are cross-sectional diagrams illustrating step ST33 as shown in FIG. 5. Processes shown in FIGS. 9A, 9B, and 9C may be performed after the processes as described above with reference to FIGS. 7A, 7B, and 7C. FIGS. 9A to 9C are enlarged views of the structure provided by the processes shown in FIGS. 7A to 7C. For example, FIGS. 9A to 9C are partial views of the first portion P1 and the second portion P2 of the channel layer 123, the first interlayer insulating layer 105, the plurality of conductive patterns 107, the plurality of second interlayer insulating layers 109, the memory layer 121, and the core insulating layer 125 associated with the first and second portions P1 and P2.

FIG. 9A is a cross-sectional diagram illustrating an embodiment of step ST33A shown in FIG. 6.

Referring to FIG. 9A, step ST33A may be performed after the processes as described above with reference to FIGS. 7A, 7B, and 7C. Step ST33A may be performed by a chemical mechanical polishing (CMP) method. The substrate 101 as shown in FIG. 7C may be removed by CMP, and a portion of the memory layer 121 and a portion of the first portion P1 of the channel layer 123 may be removed. As a result, the core insulating layer 125 may be exposed.

FIG. 9B is a cross-sectional diagram illustrating examples of steps ST33B and ST33C as shown in FIG. 6.

Referring to FIG. 9B, by performing steps ST33B and ST33C as described above with reference to FIGS. 8A and 8B, a doped semiconductor layer 185' which includes a crystalline area 185A1' and an amorphous area 185A2' may be formed on the first surface SU1 of the first interlayer insulating layer 105. The crystalline area 185A1' may be defined by irradiating a laser beam having the first energy density E1 onto the surface of the amorphous semiconductor layer as described above with reference to FIG. 8B. An irradiation range of the laser beam may be controlled so that the amorphous area 185A2' of the doped semiconductor layer 185' may be disposed between the remaining first portion P1 of the channel layer 123 and the crystalline area 185A1'.

FIG. 9C is a cross-sectional diagram illustrating an embodiment of step ST33D shown in FIG. 6.

Referring to FIG. 9C, by performing step ST33D as described above with reference to FIG. 8C, impurities in the doped semiconductor layer 185' may be diffused into the first portion P1 of the channel layer 123, and the impurities in the doped semiconductor layer may be activated. For the diffusion and activation of the impurities, the second energy density E2 of the laser beam may be controlled such that the second energy density E2 is higher than the first energy density E1 and lower than the energy density for melting the crystalline area 185A1' of the doped semiconductor layer 185'.

Selectively, p-type impurities may be injected into the crystalline area 185A1' of the doped semiconductor layer 185'.

As described above, according to the embodiments of the present disclosure, after the surface of the amorphous doped semiconductor layer is crystallized, impurities may be diffused into the channel layer, so that a diffusion range of the impurities may be uniformly controlled. Therefore, according to an embodiment of the present disclosure, electrical characteristics of the channel layer may be uniformly controlled.

Figure 10:
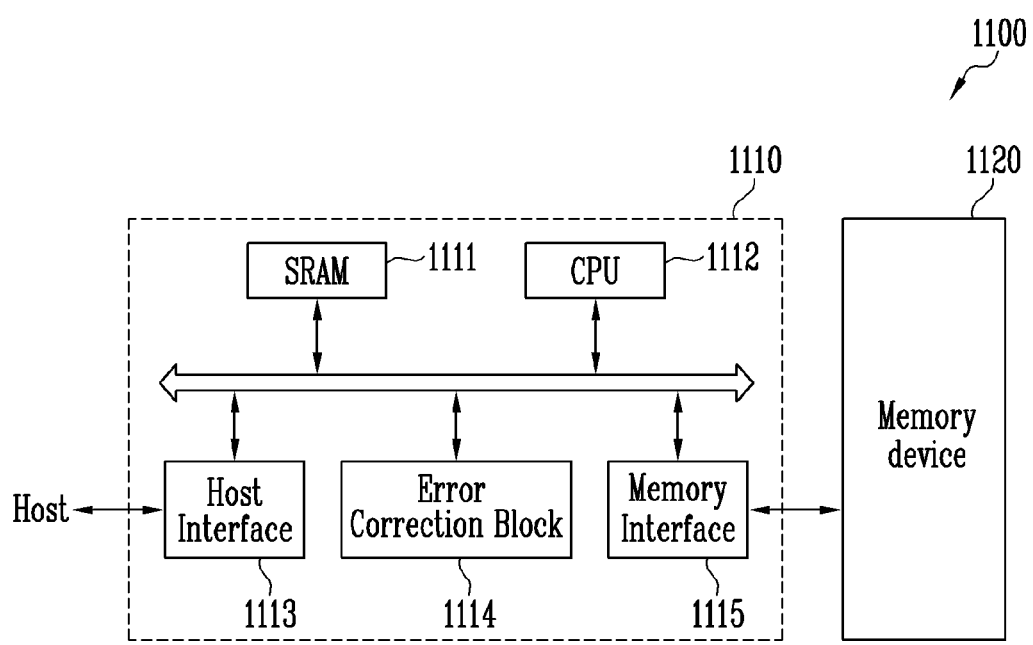
FIG. 10 is a block diagram illustrating a configuration of a memory system according to an embodiment of the present disclosure.

FIG. 10 is a block diagram illustrating a configuration of a memory system 1100 according to an embodiment of the present disclosure.

Referring to FIG. 10, the memory system 1100 may include a memory device 1120 and a memory controller 1110.

The memory device 1120 may be a multi-chip package which includes a plurality of flash memory chips. The memory device 1120 may include a stacked structure including a plurality of interlayer insulating layers and a plurality of conductive patterns, a doped semiconductor layer including an amorphous area overlapping the stacked structure and a crystalline area overlapping the stacked structure with the amorphous area interposed between the stacked structure and the crystalline area, and a channel layer passing through the stacked structure.

The memory controller 1110 may be configured to control the memory device 1120, and may include static random access memory (SRAM) 1111, a central processing unit (CPU) 1112, a host interface 1113, an error correction block 1114, and a memory interface 1115. The SRAM 1111 may serve as operation memory of the CPU 1112, the CPU 1112 may perform an overall control operation for data exchange of the memory controller 1110, and the host interface 1113 may include a data exchange protocol of a host connected to the memory system 1100. In addition, the error correction block 1114 may detect and correct an error included in data read from the memory device 1120, and the memory interface 1115 may perform interfacing with the memory device 1120. In addition, the memory controller 1110 may further include read only memory (ROM) that stores code data for interfacing with the host.

The memory system 1100 may be a memory card or a solid state drive (SSD) into which the memory device 1120 and the memory controller 1110 are integrated. For example, when the memory system 1100 serves as the SSD, the memory controller 1110 may communicate with an external device (e.g., a host) through one of the interface protocols including Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

Figure 11:
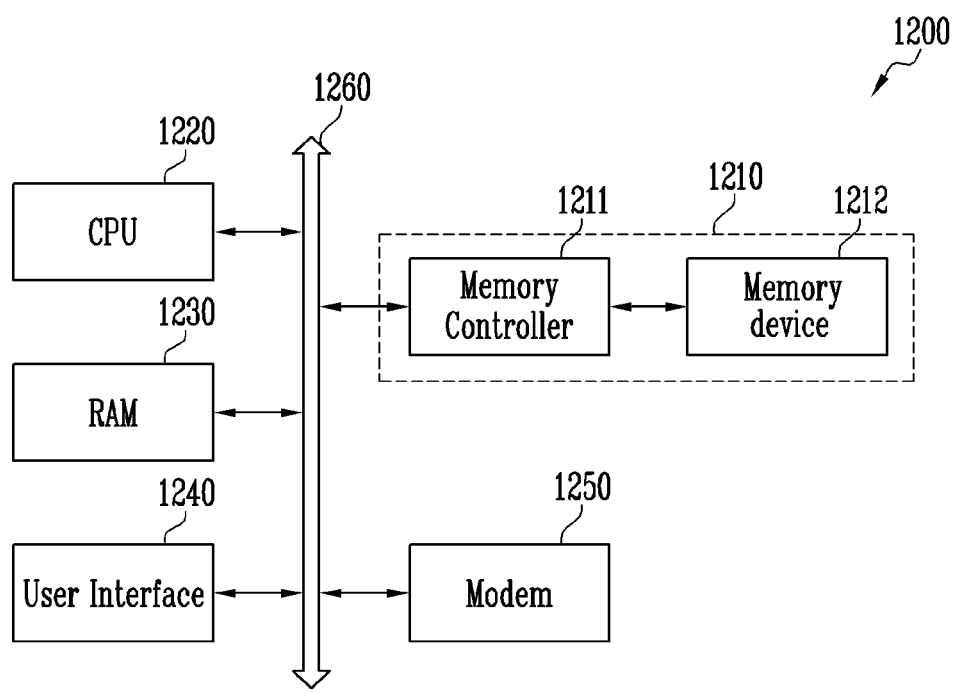
FIG. 11 is a block diagram illustrating a configuration of a computing system according to an embodiment of the present disclosure.

FIG. 11 is a block diagram illustrating a configuration of a computing system 1200 according to an embodiment of the present disclosure.

Referring to FIG. 11, the computing system 1200 may include a CPU 1220, random access memory (RAM) 1230, a user interface 1240, a modem 1250, and a memory system 1210 which are electrically connected to a system bus 1260. In addition, when the computing system 1200 is a mobile device, a battery for supplying an operating voltage to the computing system 1200 may be further included. In addition, an application chipset, an image processor, mobile DRAM, and the like may be further included.

The memory system 1210 may include a memory device 1212 and a memory controller 1211.

The memory device 1212 may include a stacked structure including a plurality of interlayer insulating layers and a plurality of conductive patterns, a doped semiconductor layer including an amorphous area overlapping the stacked structure and a crystalline area overlapping the stacked structure with the amorphous area interposed between the stacked structure and the crystalline area, and a channel layer passing through the stacked structure.

The memory controller 1211 may have the same configuration as the memory controller 1110 as described above with reference to FIG. 10.

According to an embodiment of the present disclosure, electrical characteristics of a channel layer may be uniformly controlled, so that operating reliabilities of the semiconductor memory device may be improved.

What is claimed is:

1. A semiconductor memory device, comprising:
a plurality of conductive patterns and a plurality of second interlayer insulating layers arranged alternately with each other under a first interlayer insulating layer;
a doped semiconductor layer including an amorphous area overlapping the first interlayer insulating layer and a crystalline area overlapping the first interlayer insulating layer with the amorphous area interposed between the first interlayer insulating layer and the crystalline area;
a channel layer contacting the doped semiconductor layer and passing through the first interlayer insulating layer, the plurality of second interlayer insulating layers, and the plurality of conductive patterns; and a memory layer between each of the conductive patterns and the channel layer, a bit line over the channel layer and electrically connected to the channel layer;

a peripheral circuit structure over the bit line; and a conductive bonding pad between the bit line and the peripheral circuit structure, and connecting the bit line and the peripheral circuit structure.

2. The semiconductor memory device of claim 1, wherein a portion of the channel layer adjacent to the doped semiconductor layer includes impurities.

3. The semiconductor memory device of claim 2, wherein the impurities are n-type impurities.

4. The semiconductor memory device of claim 1, wherein the channel layer extends into the amorphous area of the doped semiconductor layer.

5. The semiconductor memory device of claim 1, wherein the amorphous area of the doped semiconductor layer is arranged between the channel layer and the crystalline area of the doped semiconductor layer.

6. The semiconductor memory device of claim 1, wherein the plurality of conductive patterns include a source select line, a drain select line, and a plurality of word lines between the source select line and the drain select line, and wherein a distance between the doped semiconductor layer and the source select line is smaller than a distance between the doped semiconductor layer and each of the plurality of word lines.

7. The semiconductor memory device of claim 1, further comprising:

a first interconnection coupled to the bit line; and a second interconnection coupled to the peripheral circuit structure including a transistor;

wherein the conductive bonding pad includes a first conductive bonding pad and a second conductive bonding, and the first conductive bonding pad and the second conductive bonding pad is bonded to each other the first conductive bonding pad is coupled to the first interconnection, and the second conductive bonding pad is coupled to the second conductive bonding pad is coupled to the second interconnection.

8. The semiconductor memory device of claim 1, wherein the channel layer directly contacts the crystalline area of the doped semiconductor layer.

9. The semiconductor memory device of claim 1, wherein the crystalline area of the doped semiconductor layer includes n-type impurities.

10. The semiconductor memory device of claim 1, wherein the amorphous area of the doped semiconductor layer includes n-type impurities.

* * * * *